(12) United States Patent
Lei

(10) Patent No.: US 7,880,096 B2
(45) Date of Patent: Feb. 1, 2011

(54) SHIELDING DEVICE WITH A REPLACEABLE TOP

(75) Inventor: Gao-Bing Lei, ShenZhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 73 days.

(21) Appl. No.: 12/317,832

(22) Filed: Dec. 29, 2008

(65) Prior Publication Data

US 2009/0178841 A1    Jul. 16, 2009

(30) Foreign Application Priority Data

Dec. 29, 2007    (CN) .................... 2007 2 0129813 U

(51) Int. Cl.
*H05K 9/00*    (2006.01)
(52) U.S. Cl. ...................... 174/382; 361/816
(58) Field of Classification Search ................ 174/377, 174/382; 361/816, 818
See application file for complete search history.

(56) References Cited

U.S. PATENT DOCUMENTS

| 5,614,694 | A  | * | 3/1997 | Gorenz et al. | 174/375 |
| 6,178,097 | B1 | * | 1/2001 | Hauk, Jr. | 361/816 |
| 6,384,324 | B2 | * | 5/2002 | Flegeo | 174/390 |
| 6,501,016 | B1 | * | 12/2002 | Sosnowski | 174/382 |
| 6,897,371 | B1 | * | 5/2005 | Kurz et al. | 174/382 |
| 7,119,286 | B1 | * | 10/2006 | Horng | 174/379 |
| 7,491,899 | B2 | * | 2/2009 | Zuehlsdorf et al. | 174/372 |
| 2002/0139552 | A1 | * | 10/2002 | Chang | 174/35 R |

* cited by examiner

*Primary Examiner*—Hung V Ngo
(74) *Attorney, Agent, or Firm*—Ming Chieh Chang; Wei Te Chung; Andrew C. Cheng

(57) ABSTRACT

A shielding device with a replaceable top, comprising: a metallic frame 1 having side walls interconnected with a top portion having a top surface 10 thereon; a removable top surface 12 attached to the top surface 10; and a metallic cap 2 attached to the frame when the removable top surface 12 is removed from the metallic frame 1.

7 Claims, 3 Drawing Sheets

SHIELDING DEVICE WITH A REPLACEABLE TOP

BACKGROUND OF THE INVENTION

1. Field of the Invention

The present invention relates to a shielding device, and more particularly, to a shielding device with a removable top surface for facilitating rework of electronic components enclosed therein, and then replaced with a metallic top after the rework is completed.

2. Background of the Invention

Electromagnetic interference is a problem which are frequently met in communication equipments, electromagnetic wave of a certain frequency is always radiated when the electric current pass the galvanic circle, if the said frequency level is close to or same with the other electrical components' frequency level, the working performance of electrical components will be affected, especially to the cell phones and other communication equipments which transmit signals by electromagnetic wave.

In order to eliminate the electromagnetic interference, a metallic frame always be set above or around the related electrical components of the communication equipments, the metallic frame can help to prevent the communication equipments from the affection of the electromagnetic interference, also can release the static on itself caused by electromagnetic interference. Nowadays the metallic frames are always manufactured as two-pieces sets on account of the convenience of replacement of the electrical component. As shown in FIG. 1, a plurality of holes 51 are set on the frame 5, the cover 6 has dimples 61 which cooperate with the holes 51.

Unfortunately, problems continue to be encountered with the electrical card connectors mentioned above. Because the probability of happening of the electrical components replacement is small, two-pieces sets are not necessary to every metallic frame; this kind of design would make a high cost. Therefore, an improved shielding device is desired to overcome the disadvantages of the prior arts.

SUMMARY OF THE INVENTION

An object, therefore, of the invention is to provide a new and improved shielding device of the character described able to reduce the cost of manufacture.

In order to achieve the object set forth, a shielding device in accordance with the present invention comprises a metallic frame having side walls interconnected with a top portion having a top surface thereon; a removable top surface attached to the top surface; and a metallic cap attached to the frame when the removable top surface is removed from the metallic frame.

As disclosed herein, if the electrical components need to be replaced, users just need to tear the removable top; if not, the metallic frame can eliminate the electromagnetic interference by itself. This kind of design is helpful to the replacement of the electrical components and saving manufacture cost.

Other objects, features and advantages of the invention will be apparent from the following detailed description taken in connection with the accompanying drawings.

BRIEF DESCRIPTION OF THE DRAWINGS

The features of this invention which are believed to be novel are set forth with particularity in the appended claims. The invention, together with its objects and the advantages thereof, may be best understood by reference to the following description taken in conjunction with the accompanying drawings, in which like reference numerals identify like elements in the figures and in which:

DETAILED DESCRIPTION OF THE PREFERRED EMBODIMENT

Figure 1:
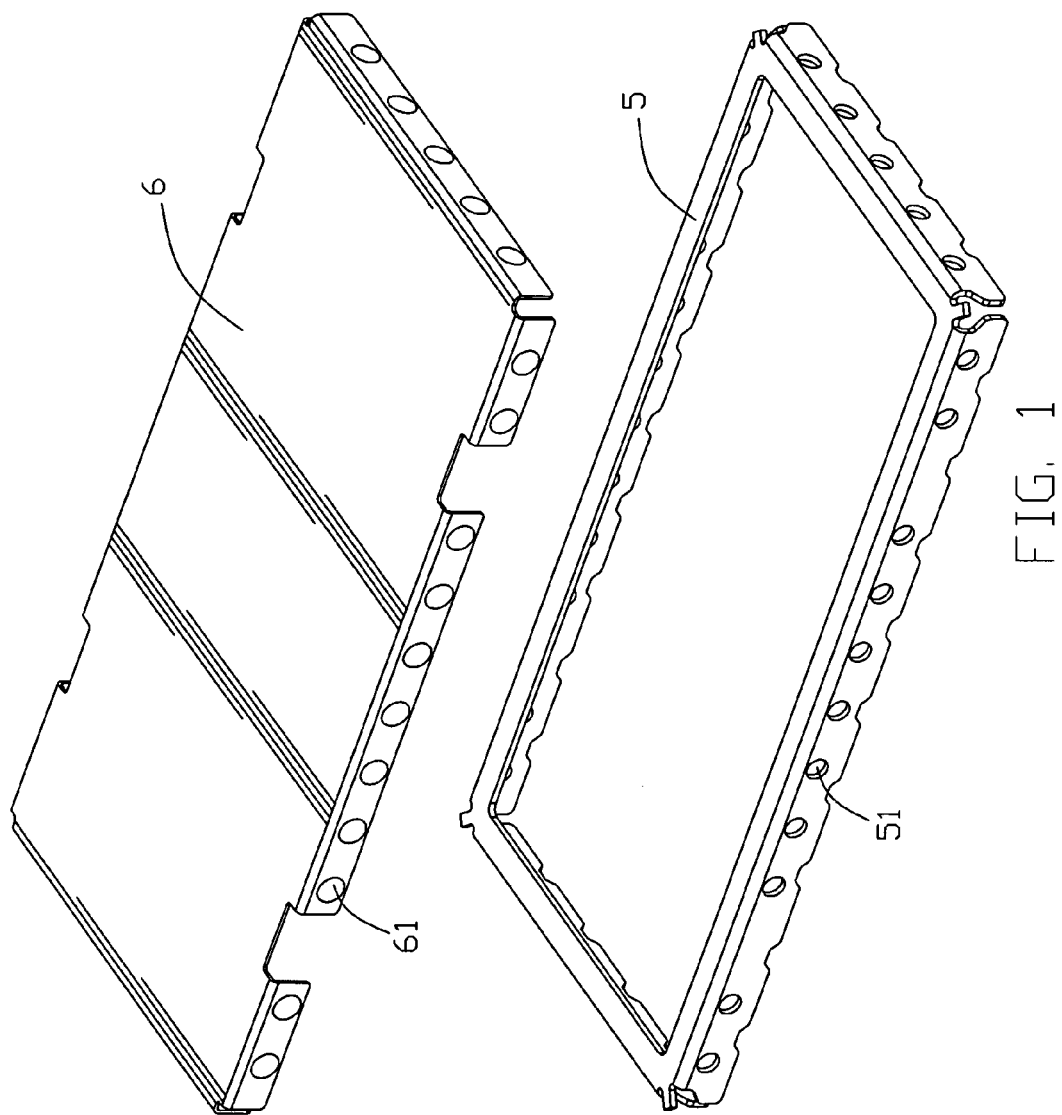
FIG. 1 is an exploded view of the shielding device embodying the concepts of the prior art.
Figure 2:
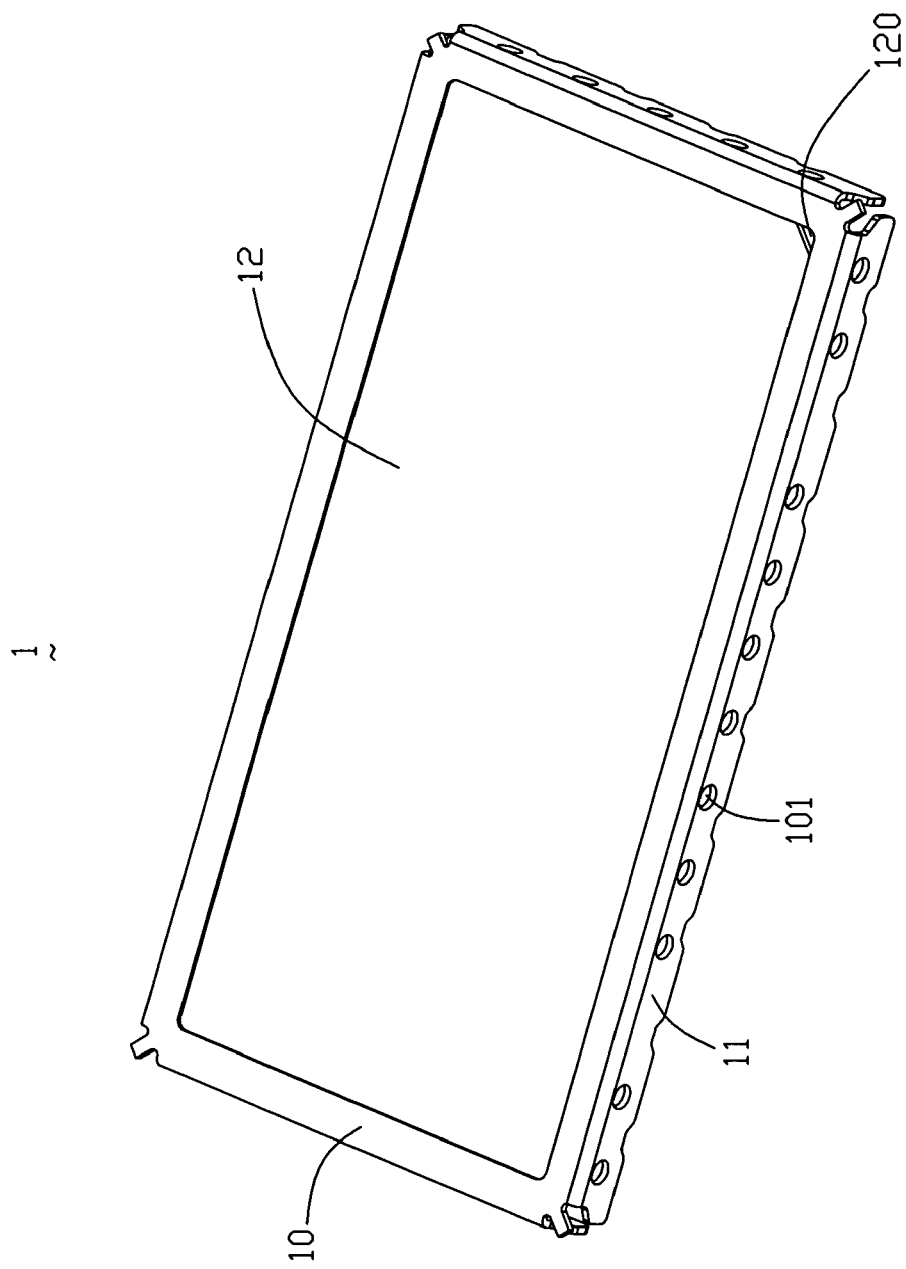
FIG. 2 is a perspective view of the metallic frame of the new shielding device.
Figure 3:
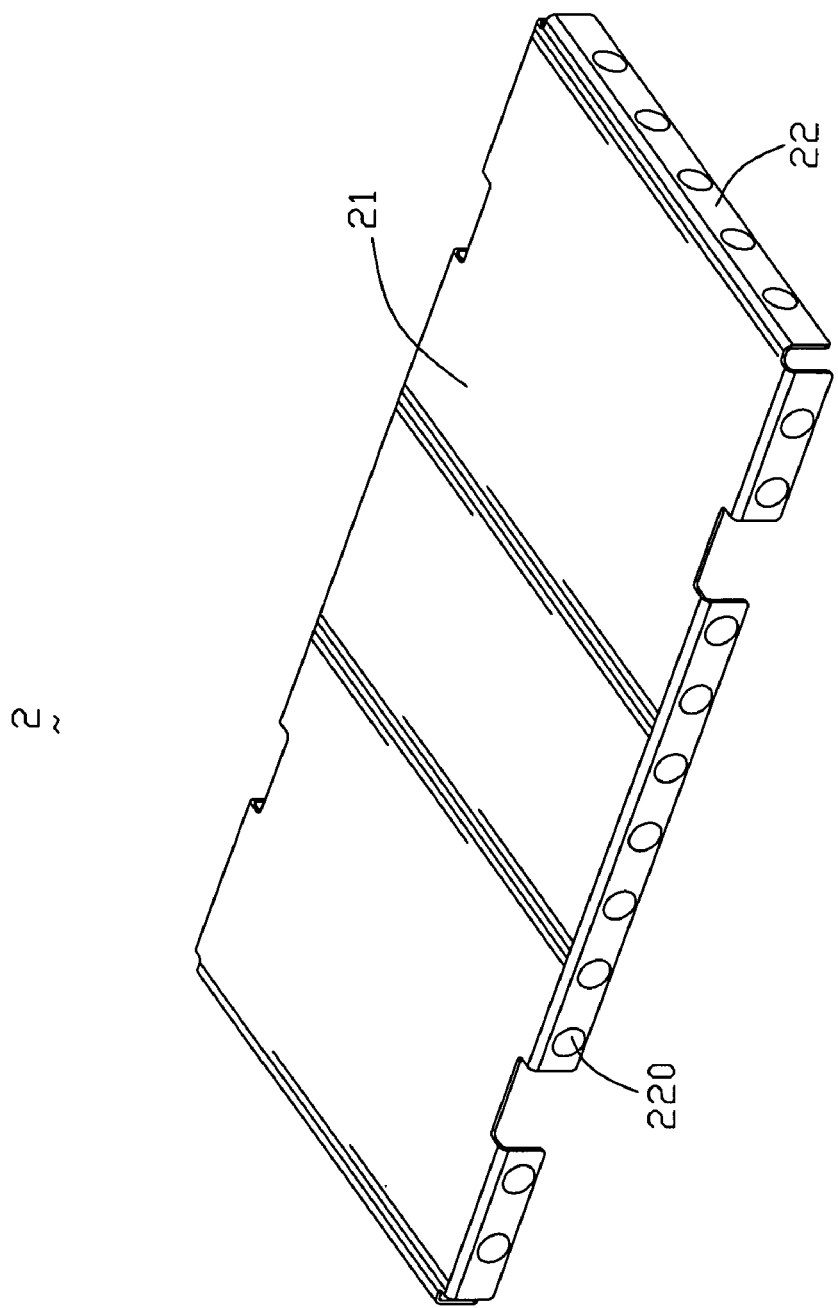
FIG. 3 is a perspective view of the metallic cap of the new shielding device.

Referring to FIGS. 2-3, a shielding device comprising a metallic frame 1 and a metallic cap 2 which covers the metallic frame 1.

The metallic frame 1 is manufactured through stamping, including a flat top surface 10 and a first sidewall 11 extended from the side of the top surface 10, a plurality of via holes 101 are defined on the first sidewall 11 from space to space. The sidewall 11 and the top surface 10 jointly form a receiving space (not labeled). The soldering portion (not labeled) is defined on the bottom of the first sidewall 11 opposite to the receiving space for fixing the metallic frame 1.

The metallic cap 2 is also manufactured through stamping, including an upper surface 21 and a second sidewall 22 which extended from the side of the upper surface 21, a plurality of dimples 220 are defined on the second sidewall 22 corresponding to the via holes 101.

The said top surface 10 has a removable top surface 12 which can be tore expediently, the removable top surface 12 and the top surface 10 are not at grade, the removable top surface 12 is lower than the top surface 10, a notch line (not labeled) is defined between the removable top surface 12 and the top surface 10 so that the removable top surface 12 can be tore easily. The said removable top surface 12 has at least one through hole 120 for a manipulator tearing the removable top surface 12 from the top surface 10.

In the ordinary course of event, the electrical components are covered by the metallic frame 1, the metallic frame 1 can help to prevent the communication equipments from the affection of the electromagnetic interference, also can release the static on itself caused by electromagnetic interference. The removable top surface 12 should be tore when anything goes wrong with the electrical components and needs to be replaced. After the replacement, assembling the metallic frame 1 and the metallic cap 2 together through the via holes 101 and the dimples 220 can prevent the communication equipments from the affection of the electromagnetic interference.

It will be understood that the invention may be embodied in other specific forms without departing from the spirit or central characteristics thereof. The present examples and embodiments, therefore, are to be considered in all respects as illustrative and not restrictive, and the invention is not to be limited to the details given herein.

While preferred embodiment in accordance with the present invention have been shown and described, equivalent modifications and changes known to persons skilled in the art according to the spirit of the present invention are considered within the scope of the present invention as defined in the appended claims.

What is claimed is:

1. A shielding device for mounting to a printed circuit board, comprising:
   a metallic frame stamped and bent from sheet metal and defining a top plate with a plurality of sidewalls unitarily extending downwardly from corresponding edges of the top plate;
   a notch line being formed on the top plate, said notch line defining and essentially surrounding a center main area of the top plate and leaving a narrow strap like margin between the notch line and the corresponding edge; and
   a metallic cap being adapted to intimately cover said frame after said frame is mounted to the printed circuit board and the center main area has been removed along said notch line during a rework process;
   wherein the center main area is lower than the narrow strap like margin so as to protect the center main area.

2. The shielding device as claimed in claim 1, wherein said cap and said frame are assembled to each other via engagement between sidewalls of the frame and those of the cap.

3. The shielding device as claimed in claim 1, wherein said cap has a similar configuration with the frame, including a top plate and a plurality of sidewalls downwardly extending from the top plate.

4. The shielding device as claimed in claim 1, wherein a cutout is formed adjacent to a portion of the notch line so as to define a grasping position of said removable center main area of the top plate.

5. A shielding device for mounting to a printed circuit board, comprising:
   a metallic frame including a top plate with a plurality of sidewalls unitarily extending downwardly from corresponding edges of the top plate, bottom edges of the sidewalls being configured to be mounted to the printed circuit board; and
   a notch line formed in the top plate and moving essentially along corresponding edges to surround a center main area of the top plate as large as possible; wherein
   said center main area is adapted to be removed from the top plate along the notch line so as to expose electronic components on the printed circuit board as many as possible for rework;
   wherein the center main area is lower than a narrow strap like margin so as to protect the center main area.

6. The shielding device as claimed in claim 5, further including a metallic cap to intimately cover said frame on the printed circuit board after rework.

7. The shielding device as claimed in claim 6, wherein said cap is configured to be similar to said frame while without the notch line.

* * * * *